(12) United States Patent
Kondo et al.

(10) Patent No.: US 7,085,172 B2
(45) Date of Patent: Aug. 1, 2006

(54) DATA STORAGE APPARATUS, DATA STORAGE CONTROL APPARATUS, DATA STORAGE CONTROL METHOD, AND DATA STORAGE CONTROL PROGRAM

(75) Inventors: Tetsujiro Kondo, Tokyo (JP); Hiroki Tetsukawa, Kanagawa (JP); Kenji Takahashi, Kanagawa (JP); Hiroshi Sato, Tokyo (JP); Masaki Handa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/023,441

(22) Filed: Dec. 29, 2004

(65) Prior Publication Data

US 2005/0169062 A1   Aug. 4, 2005

(30) Foreign Application Priority Data

Jan. 5, 2004   (JP)   ............................. 2004-000570

(51) Int. Cl.
*G11C 16/04*   (2006.01)
(52) U.S. Cl. .................................. 365/189.04; 365/221
(58) Field of Classification Search ........... 365/189.04, 365/221
See application file for complete search history.

(56) References Cited

U.S. PATENT DOCUMENTS 6,134,169 A    10/2000   Tanaka
2005/0180221 A1*  8/2005   Kondo et al. .......... 365/189.05

OTHER PUBLICATIONS

Patent Abtracts of Japan, JP 02-051781, Feb. 21, 1990.

* cited by examiner

*Primary Examiner*—Tuan T. Nguyen
*Assistant Examiner*—Pho M. Luu
(74) *Attorney, Agent, or Firm*—Oblon, Spivak, McClelland, Maier & Neustadt, P.C.

(57) ABSTRACT

When all data is stored in a memory composed of a plurality of memory banks, a data division determination section divides all the data into a plurality of data regions. The data in the regions is allocated among the plurality of memory banks, and the data is stored in one word line in each memory bank, so that all the data is arranged in the memory. A memory control section, an address conversion section, and an address generation section perform control for periodically reading a plurality of pieces of data to be simultaneously read in each region from all the data arranged in the memory, sequentially replacing or overwriting with some of the data in the adjacent region, and reading a plurality of pieces of data to be simultaneously read next.

10 Claims, 14 Drawing Sheets

DATA STORAGE APPARATUS, DATA STORAGE CONTROL APPARATUS, DATA STORAGE CONTROL METHOD, AND DATA STORAGE CONTROL PROGRAM

BACKGROUND OF THE INVENTION

1. Field of the Invention

The present invention relates to a data storage apparatus for storing all data in a memory composed of a plurality of memory banks and for performing simultaneous reading of a desired number of pieces of data, a data storage control apparatus for use therewith, a data storage control method for use therewith, and a data storage control program for use therewith.

2. Description of the Related Art

As shown in FIG. 20, a semiconductor memory is configured to access a memory cell MC by specifying a word line WL and a bit line BL, so that data stored in the memory cell MC at a position where the activated one word line and the bit line intersect is read. % In the semiconductor memory having such a configuration, since the same bit line is shared among data of a plurality of word lines, if, as shown in FIG. 21, a plurality of word lines WL1 and WL2 are specified, the data that is output on the bit line is destroyed. For this reason, simultaneous access cannot be made to data of different word lines.

It is possible to simultaneously read data from independent memory banks. As shown in FIG. 22, as a result of dividing the memory into a plurality of memory banks BK1 to BKn and specifying a different address for each memory bank, simultaneous access can be made to data of a plurality of word lines. However, simultaneous access to data of different word lines within the memory bank cannot be made. That is, data that can be read simultaneously is data stored in the same word line from each bank, and data stored in different word lines in the same memory bank cannot be read simultaneously.

Here, the memory bank is an area having a fixed capacity, which is used as a unit for managing the memory. Therefore, access conflicts of data do not occur between independent memory banks. The memory is composed of one or more memory banks.

Hitherto, by recognizing a specific data arrangement contained in input data, for example, processing such as pattern recognition of image data and motion detection thereof, is performed.

For example, a buffer memory capable of storing image data for several lines and outputting it in units of pixels, a data processor including a plurality of processor elements capable of processing data having a width of several bits and capable of performing data processing concurrently by a plurality of processor elements, and a control information memory for storing matching reference data and control data are provided. By using a threshold value, each processor element of the data processor binarizes an image data group in a matrix with the pixel of interest being the center, which is assigned to its own element, within the image data output by the buffer memory, into object data that is divided at a bit width of a serial arrangement, which can be processed by the processor element. Each processor element then determines whether or not that data matches reference data that exists at the same format in a control information memory (for example, see Japanese Unexamined Patent Application Publication No. 2003-203236).

In the field of moving-image processing, motion, that is, the movement direction and the size (or the speed) of an object in the image that differs with respect to time, is used. For example, motion is used in motion compensation interframe coding in high-efficiency coding of images and in parameter control using motion in a television noise reduction apparatus by an inter-frame time domain filter. As a motion detection method for determining a motion, a block matching method is known.

In a motion detection method for detecting the motion within an image signal, the applicant of the present invention has previously proposed a motion detection method having two steps, that is, (a) a step of generating an integration value table using a matching method for each entire screen or each comparatively large block, in which one screen is divided into a plurality of portions, and extracting one or more candidate vectors for each entire screen or for each comparatively large block in which one screen is divided into a plurality of portions by using the integration value table, and (b) a step of performing matching by using the candidate vectors, and determining a motion vector for each pixel or a comparatively small block. In this two-step motion detection method, in each of the processes of the two steps, that is, representative point matching and vector assignment, in which image motion detection is performed by representative point matching in the two-step method, the desired number of pieces of pixel data in the image need to be read simultaneously (see, for example, Japanese Unexamined Patent Application Publication No. 2001-61152).

In a semiconductor memory, when each memory bank is formed by only one word line, simultaneous reading of data is possible without the data being destroyed unlike that described above. However, when the amount of data to be stored becomes enormous, the number of memory banks increases, resulting in a burden on hardware, which is not practical.

Therefore, in the conventional technology, a buffer and a cache for reading and temporarily storing data are provided, so that a desired number of pieces of data are divided a plurality of times with respect to time, and they are temporarily stored in and read from the buffer and the cache.

However, when the desired number of pieces of data increases and data input/output are performed at a higher speed, the data reading process is delayed with respect to time. In order to solve this problem, the size of the temporary storage buffer and cache can be increased, but if the area becomes larger, the hardware requirements increase.

SUMMARY OF THE INVENTION

Accordingly, in view of the above-described conventional problems, an object of the present invention is to provide a data storage apparatus capable of storing all data in a memory composed of a plurality of memory banks without causing the hardware requirements to increase and capable of performing simultaneous reading of a desired number of pieces of data, a data storage control apparatus for use therewith, a data storage control method for use therewith, and a data storage control program for use therewith.

In one aspect, the present invention provides a data storage apparatus including: a memory composed of a plurality of memory banks; data division determination means for determining the region in which a desired number of pieces of data to be read simultaneously exist as data division units on the basis of a detection pattern; and memory control means for controlling writing/reading of data to and from the memory, wherein the memory control means divides all the data into a plurality of data regions on the basis of the division units from the data division determination means, allocates the data in each region among the plurality of memory banks, and stores the data in one word line in each of the memory banks, so that control is performed in such a way that a plurality of pieces of data to be simultaneously read in each of the regions is periodically read from all of the data arranged in the memory, some of the data in each of the regions is sequentially replaced with or rewritten with the data of the adjacent region, and a plurality of pieces of data to be read simultaneously next are read.

In another aspect, the present invention provides a data storage control apparatus including:

data division determination means for determining the region in which a desired number of pieces of data to be read simultaneously exist as data division units on the basis of a detection pattern; and memory control means for controlling writing/reading of data to and from the memory composed of a plurality of memory banks, wherein the memory control means divides all data into a plurality of data regions on the basis of the division units from the data division determination means, allocates the data in each region among the plurality of memory banks, and stores the data in one word line in each of the memory banks, so that control is performed in such a way that a plurality of pieces of data to be simultaneously read in each of the regions is periodically read from all of the data arranged in the memory, some of the data in each of the regions is sequentially replaced with or rewritten with the data of the adjacent region, and a plurality of pieces of data to be read simultaneously next are read.

In another aspect, the present invention provides a data storage control method including the steps of: dividing all data into a plurality of data regions by using the region in which a desired number of pieces of data to be simultaneously read exist as division units when all the data is stored in a memory composed of a plurality of memory banks; allocating the data in each region among the plurality of memory banks; storing the data in one word line in each memory bank; periodically reading a plurality of pieces of data to be simultaneously read in each of the regions from all of the data arranged in the memory; sequentially replacing or rewriting some of the data in each of the regions with the data within the adjacent region; and reading a plurality of pieces of data to be simultaneously read next.

In another aspect, the present invention provides a data storage control program for enabling a computer to perform data storage control for storing all data in a memory composed of a plurality of memory banks and for performing simultaneous reading of a desired number of pieces of data, the data storage control program including: dividing all the data into a plurality of data regions by using the region in which a desired number of pieces of data to be simultaneously read exist as division units when all the data is stored in the memory composed of a plurality of memory banks; allocating the data in each region among the plurality of memory banks; storing the data in one word line in each memory bank; periodically reading a plurality of pieces of data to be simultaneously read in each of the regions from all of the data arranged in the memory; sequentially replacing or rewriting some of the data in each of the regions with the data within the adjacent region; and reading a plurality of pieces of data to be simultaneously read next.

In the present invention, data in regions in which a desired number of pieces of data exists is arranged in such a manner as to be simultaneously readable, and all the data is divided based on the period of the above region and is arranged periodically. The data in regions in which simultaneous reading is possible in the initial arrangement is periodically read, and interchanging operations are performed in sequence. This makes it possible to simultaneously read a desired number of pieces of data in the entire data.

DETAILED DESCRIPTION OF THE PREFERRED EMBODIMENTS

Embodiments of the present invention will now be described below in detail with reference to the drawings. The present invention is not limited to the embodiments described below, and can be changed as desired without departing from the spirit and scope of the present invention.

Figure 1:
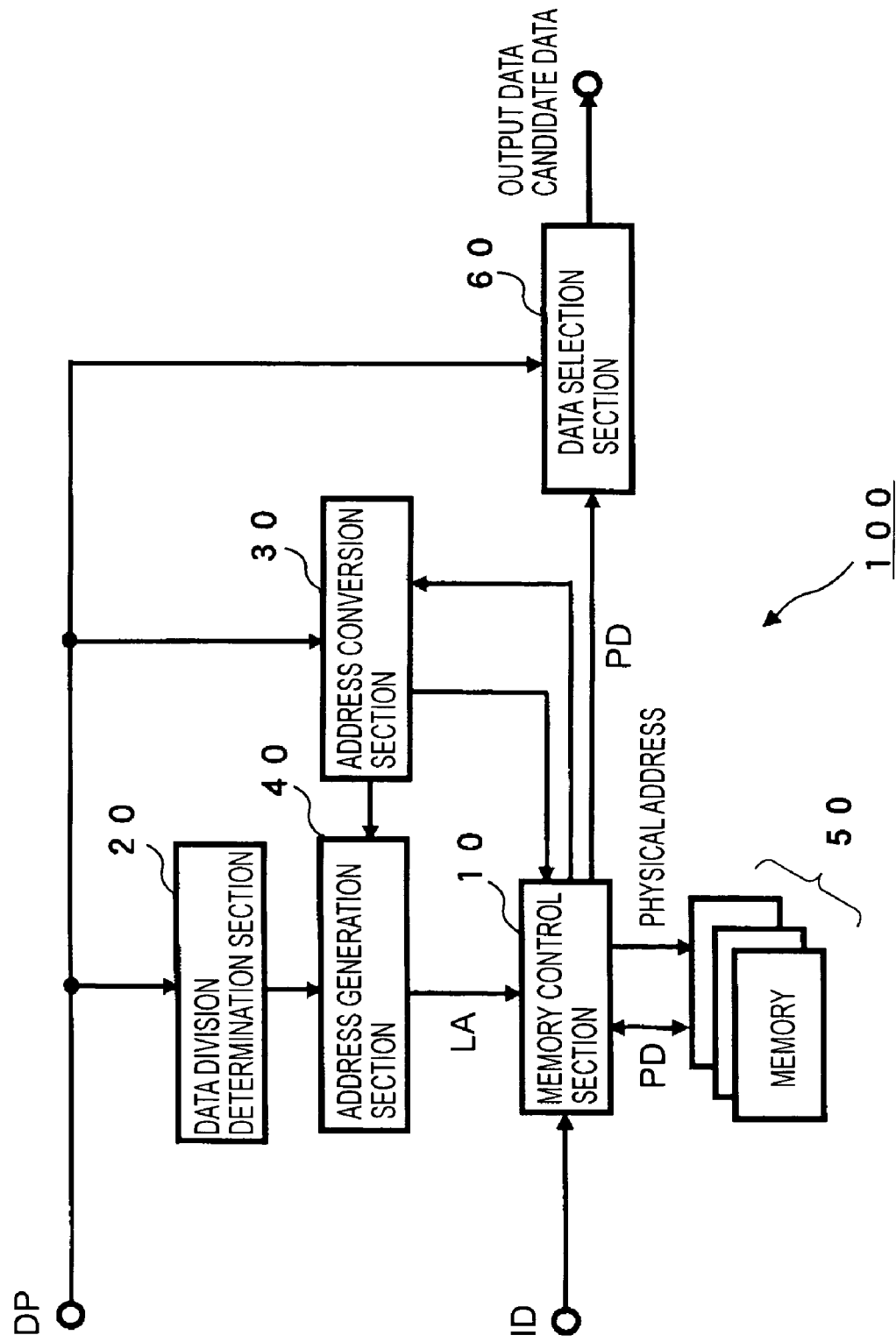
FIG. 1 is a block diagram showing the configuration of a data storage apparatus according to an embodiment of the present invention.

The present invention is embodied by, for example, a data storage apparatus 100 shown in FIG. 1.

The data storage apparatus 100 includes a memory control section 10 to which image data IP is supplied, a data division determination section 20 to which a detection pattern DP is supplied, an address conversion section 30, a data selection section 60, an address generation section 40 for generating a logical address on the basis of the output of the data division determination section 20 and the address conversion section 30 and for supplying the logical address to the memory control section 10, and a memory 50, composed of a plurality of memory banks, to and from which pixel data PD is written and read by the memory control section 10, so that the pixel data PD read from the memory 50 is output via the data selection section 60.

Figure 2:
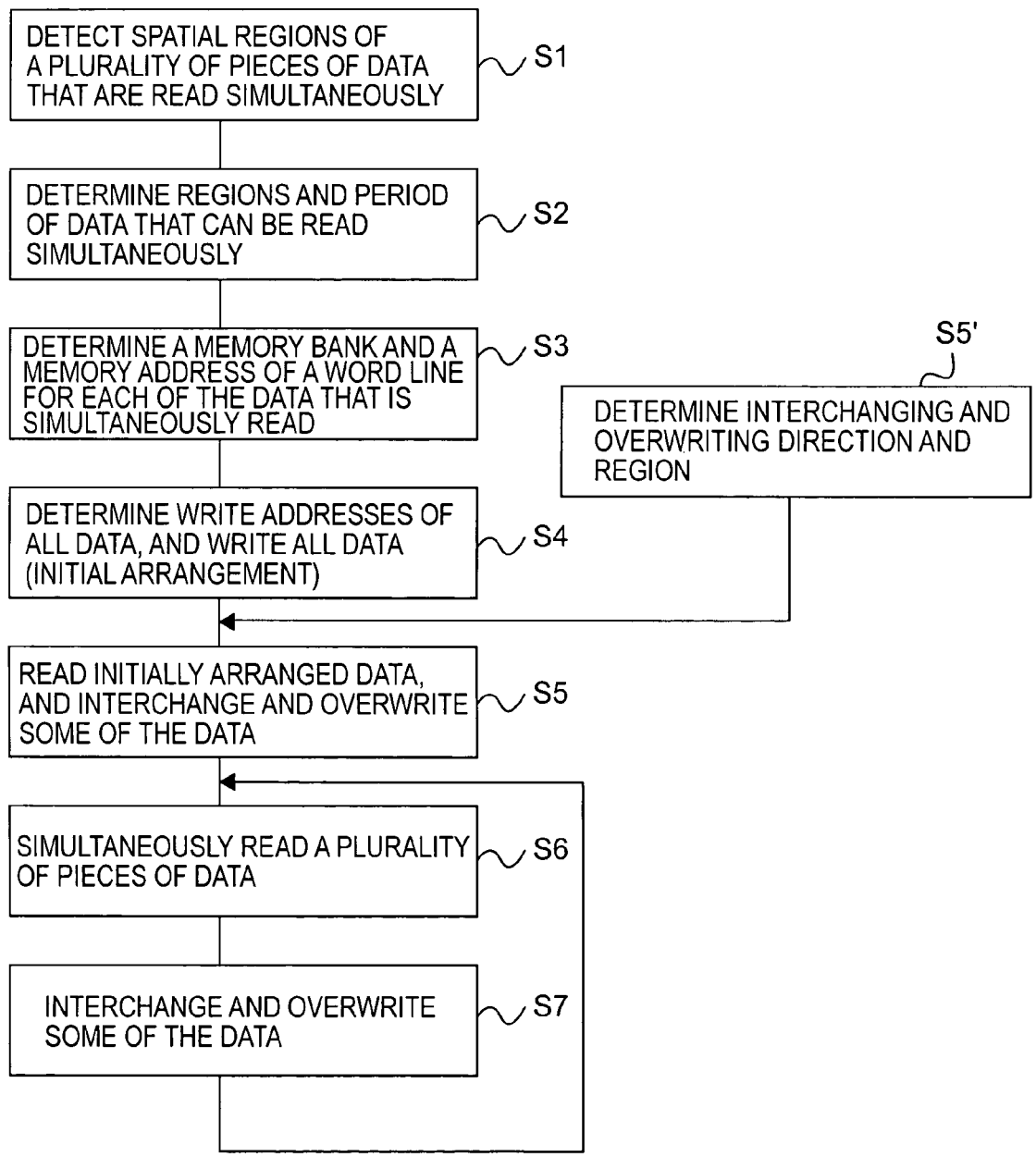
FIG. 2 is a flowchart showing the procedure for data storage control performed by a memory control section in the data storage apparatus.

In the data storage apparatus 100, the memory control section 10 is formed by, for example, a microprocessor. The memory control section 10 performs processing for initially arranging data, interchanging and overwriting some of the initially arranged data, and simultaneously reading a desired number of pieces of data in accordance with a data storage control program stored in a program memory (not shown), as shown in the flowchart of FIG. 2.

More specifically, initially, the memory control section 10 detects, from the data division determination section 20, the spatial region of a plurality of pieces of pixel data to be simultaneously read, indicated by the detection pattern DP (step S1), determines the region and the period of the data that can be simultaneously read (step S2), and determines a memory bank and a memory address of a word line for each of the data that is simultaneously read (step S3).

Next, the memory control section 10 determines the writing address of all the image data, and writes the image data in the memory 50 so as to be initially arranged (step S4).

The initial arrangement of all the image data is described below.

Data in a region in which a desired number of pieces of pixel data exist is arranged in the same word line of each memory bank. This makes it possible to simultaneously read a desired number of pieces of pixel data. In the first memory bank, data may be stored in the N-th word line, and in the second memory bank, data may be stored in the M-th word line. Note that N and M may be the same.

Next, all the image data is divided by using the region in which the data exists or a region in the region as one period. The data divided according to the region is arranged in the word line of each memory bank. As a result, a plurality of pieces of pixel data that exists in each region can be simultaneously read.

However, in this initial arrangement, when the data extends over the regions, a plurality of pieces of pixel data cannot be simultaneously read.

Therefore, the memory control section 10 reads the initially arranged data from the memory 50, interchanges some of the data, and overwrites it in the memory 50 (step S5).

More specifically, the data is rearranged so that, by interchanging some of the data after a plurality of pieces of initially arranged pixel data in each region is read, the plurality of pieces of pixel data in the region, which could not be simultaneously read previously, can be simultaneously read.

At this time, the original data in the location where an interchange is made is moved to another memory or an unused portion of the memory so as to be saved. As a result of simultaneously performing saving and overwriting so that the initial data is not erased, it becomes possible to simultaneously read a desired number of pieces of pixel data. Regarding the original data in the location where an interchange is made, an overwrite may be performed without saving the data when it is known that the data is unnecessary in the subsequent processing.

Here, the interchanging and overwriting direction of data may be either in the vertical direction or in the horizontal direction, and after being moved, the data may be returned to the initial arrangement again. Furthermore, the interchanging and overwriting movement of data may be continuous or noncontinuous, and the size is not limited. In order to prevent the data from being erased by overwriting, the data may be saved in an unused portion of the memory, and an unused portion having an appropriate size needs only to be provided depending on the size of the data to be interchanged and overwritten.

Before the above-described process of step S5 is performed, the interchanging and overwriting direction and the interchanging and overwriting region can be determined for the initially arranged data (step S5').

Then, the memory control section 10 simultaneously reads a plurality of pieces of data from the memory 50 (step S6), and interchanges some of the data and overwrites it in the memory 50 (step S7). The process then returns to step S6, and the processes of steps S6 and S7 are repeatedly performed.

For the memory 50, publicly known types may be used. Specific examples include SRAM, DRAM, MRAM, and FeRAM.

Figure 3:
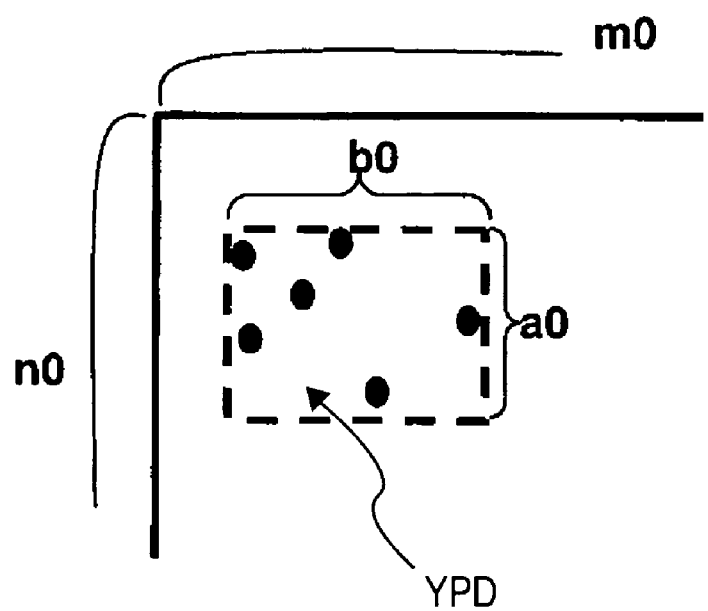
FIG. 3 is a schematic view illustrating positions of a plurality of pieces of pixel data to be simultaneously read in the entire image data.
Figure 4:
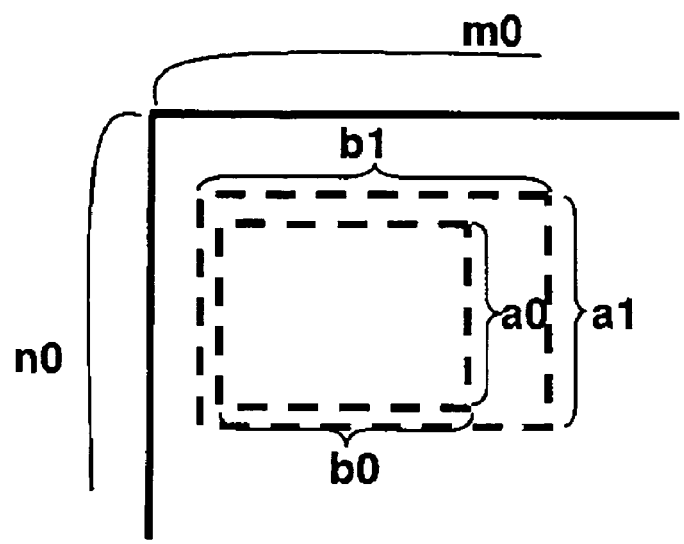
FIG. 4 is a schematic view showing the distribution of the plurality of pixel data.

Here, as shown in, for example, FIG. 3, when all the image data is set as m0×n0, it is assumed that N pieces of pixel data YPD to be simultaneously read exist, and the position in the entire image data is set as (xi, yi; 0<=i<N), as shown in FIG. 4, the distribution of the plurality of pieces of pixel data becomes a0×b0 (a0=max.xi−min.xi, b0=max.yi−min.xi).

In the initial arrangement process of step S5, the initial data arrangement is performed by using the region of a1×b1 (a1>=a0, b1>=b0) as the period.

Figure 5:
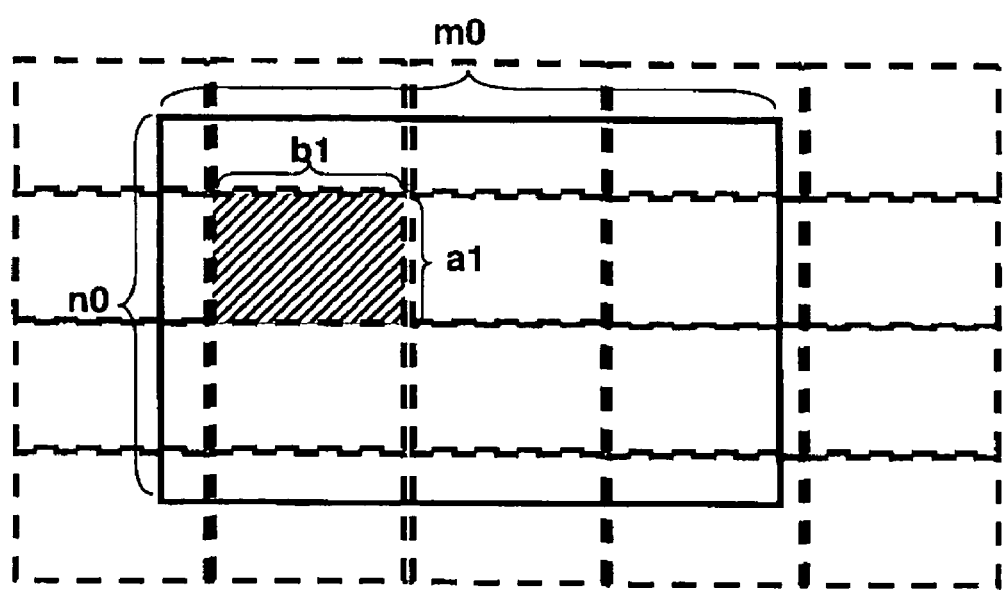
FIG. 5 is a schematic view illustrating an initial arrangement of data in the data storage apparatus.

That is, as shown in FIG. 5, for the initial data arrangement, the data in the entire image data m0×n0 is arranged by using the region of a1×b1 as the period. The data in the region of a1×b1 indicated by shading in FIG. 5 is arranged in the same word line of each memory bank, so that the data can be simultaneously read.

Figure 6:
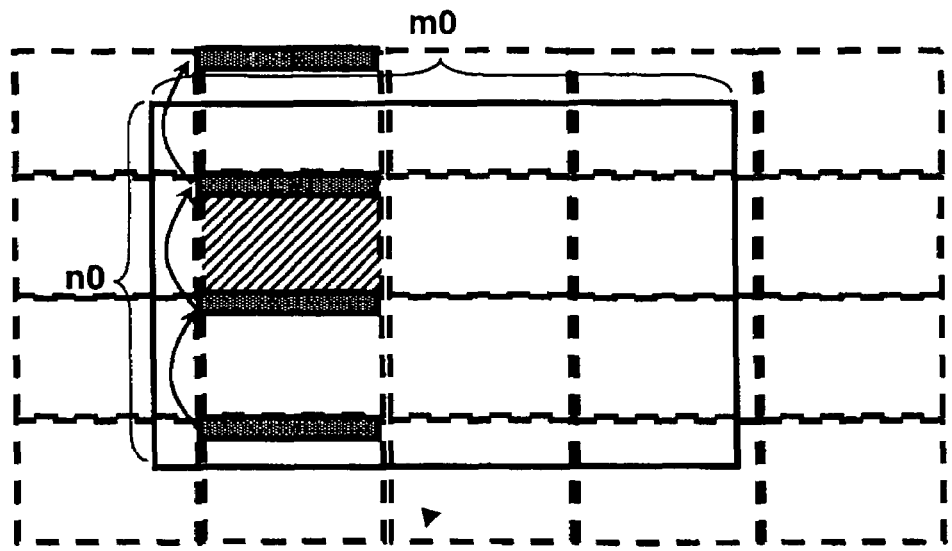
FIG. 6 is a schematic view illustrating interchanging and overwriting of data in the data storage apparatus.

Then, in the overwriting process of step S6, as shown in FIG. 6, after the data in the region of a1×b1 is periodically read, some of the data (the gray portion in FIG. 6) is interchanged with the data of the adjacent region a1×b1, and is overwritten. The gray portion to be interchanged and overwritten needs only be the region of a1×b1 or smaller.

Figure 7:
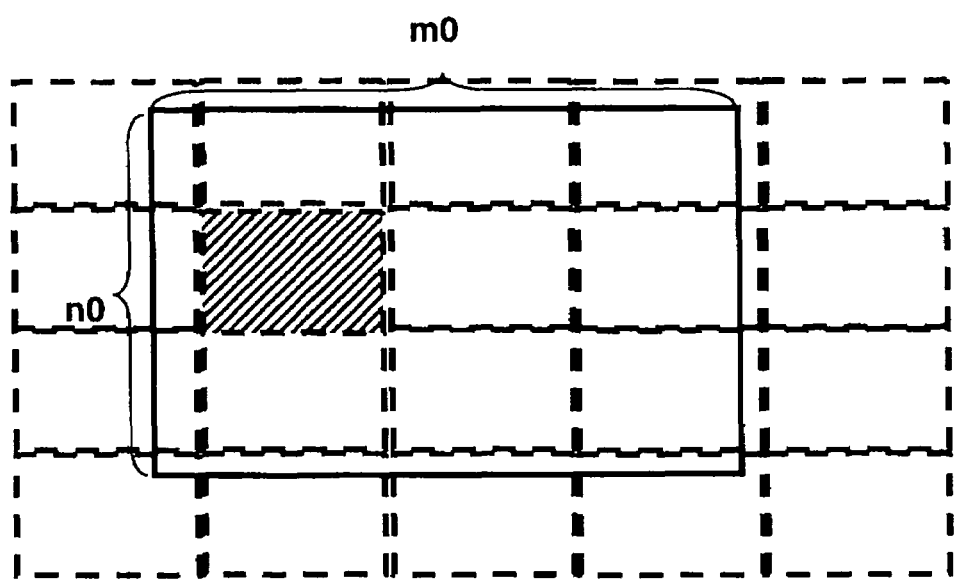
FIG. 7 is a schematic view showing the data arrangement after the data is interchanged and overwritten.

In the initial data arrangement, when the reading of all the image data is completed, that is, when the interchanging and overwriting of data are completed, as shown in FIG. 7, the data arrangement becomes such that the gray portion in FIG. 6 is deviated from the initial data arrangement.

That is, the data in the region of a1×b1 in which only the gray portion is deviated can be simultaneously read. In the arrangement of FIG. 7, the data in the region of a1×b1 lowering one gray portion in FIG. 6 from the initial arrangement of FIG. 5 can be simultaneously read.

Therefore, in steps S6 and S7, by continuing such a periodic reading, and interchanging and overwriting after the reading, all the data in the region of a1×b1 in the entire image data can be simultaneously read.

Figure 8:
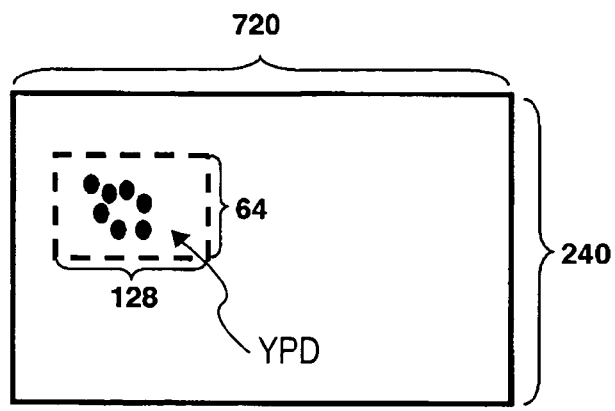
FIG. 8 is a schematic view showing all image data and a plurality of pieces of pixel data to be simultaneously read in a specific example in which all the image data is stored and a plurality of pieces of pixel data are simultaneously read in the data storage apparatus.

Next, a description is given of a specific example of storage of all the image data and simultaneous reading of a plurality of pieces of pixel data in the data storage apparatus 100. In this example, as shown in FIG. 8, the number of all the image data is 720×240, the number of pieces of data YPD to be read is 7, and the distribution of the plurality of pieces of data to be read exists in the region of 128×64.

The specific example described below is only an example, and the present invention is not limited to the specific example.

Figure 9A:
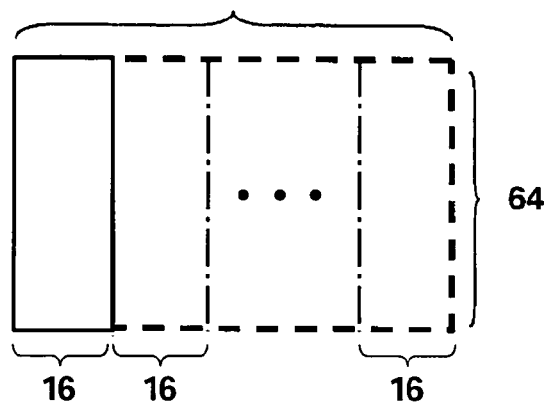
FIGS. 9A and 9B are schematic views illustrating an initial arrangement of all the image data in the specific example.
Figure 9B:
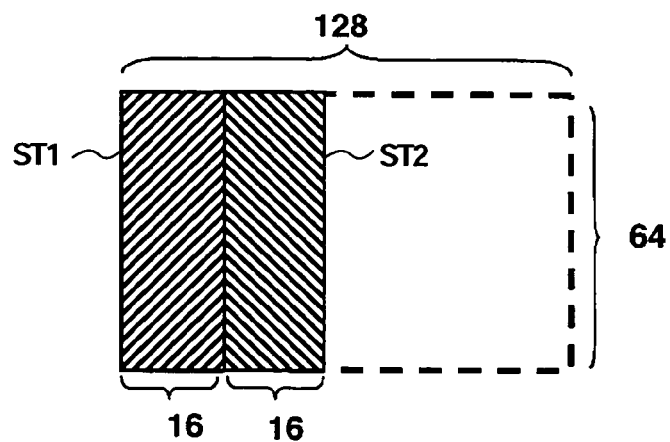

Initially, data in the region of 128×64 in which a pattern of a plurality of pieces of data to be read first exist is initially arranged. Here, a memory, composed of eight memory banks, is provided in which 1024 pixels are stored in one word line. As shown in FIGS. 9A and 9B, the region of 128×64 is divided into eight stripes of 16×64, and each stripe of 16×64 is stored in one word line of each memory bank. For example, in FIG. 9B, the stripe ST1 is stored in the n1-th word line of the first bank, and the stripe ST2 is stored on the n2-th word line of the second bank.

As a result, since the data in the region of 128×64, including 7 pieces of data to be read first, is stored in one word line of each memory bank, simultaneous reading of the data is possible.

Figure 10:
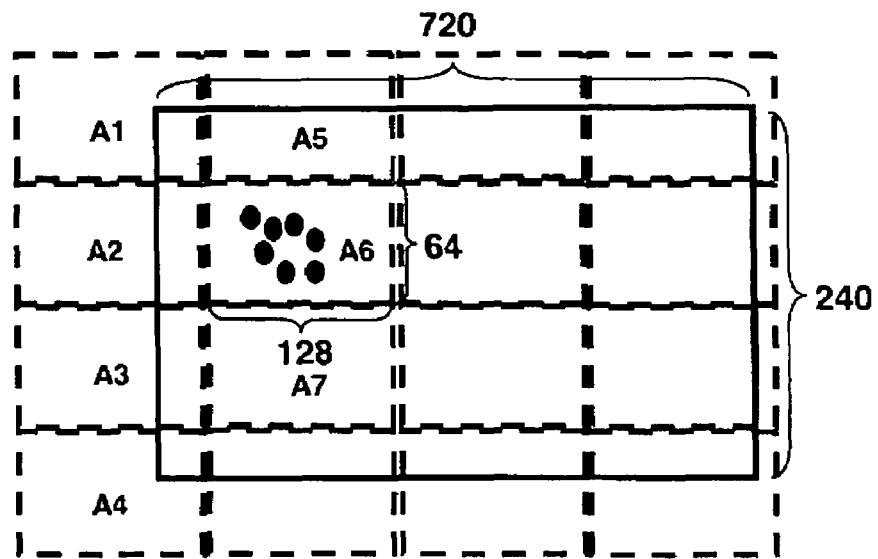
FIG. 10 is a schematic view illustrating a state in which all the image data in the specific example is divided into a plurality of data regions.

Next, as shown in FIG. 10, by using this period of 128×64, all the image data is divided into data in regions A1, A2 . . .

Figure 11:
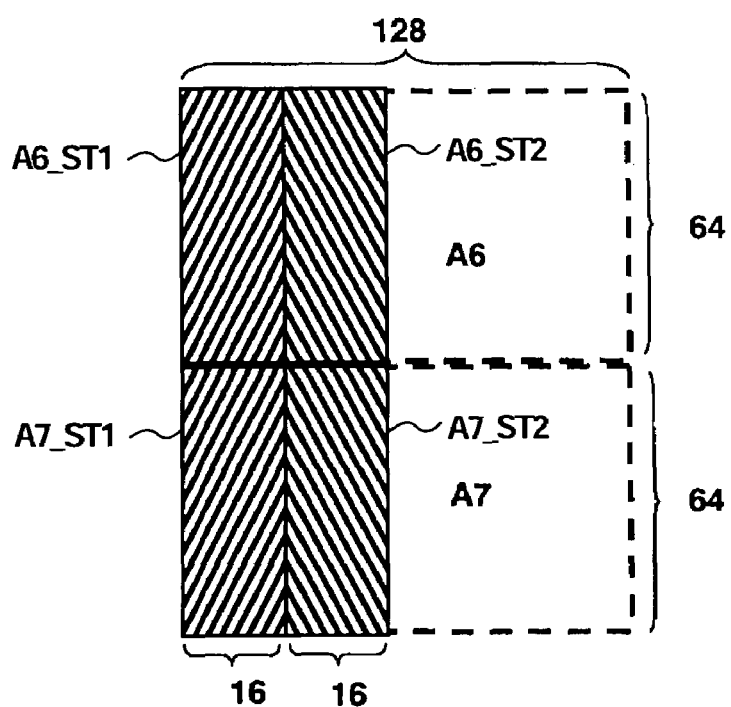
FIG. 11 is a schematic view illustrating a state in which the divided data in each region in the specific example is stored in a corresponding memory bank.

Then, as shown in FIG. 11, each of the divided data in the regions A1, A2 . . . of 128×64 is stored in one word line of each memory bank similarly to that described above.

Here, for the sake of convenience, all the divided image data, is numbered as 1, 2 . . . from the upper left end toward the bottom. The data in the region of 128×64 is stored in the first memory bank, the second memory bank, . . . , at the period of stripes of 16×64 starting from the left. In the word lines where storage is performed, the data is stored in accordance with the number of the divided data of 128×64. In the example shown in FIG. 11, since the data exists in the region A6, the data is stored in the sixth word line of each memory bank. That is, the data of the stripe A6_ST1 is stored in the sixth word line of the first bank, and the data of the stripe A6_ST2 is stored in the sixth word line of the second bank. Similarly, the data of the stripe A7_ST1 is stored in the seventh word line of the first bank, and the data of the stripe A7_ST2 is stored in the seventh word line of the second bank.

Figure 12:
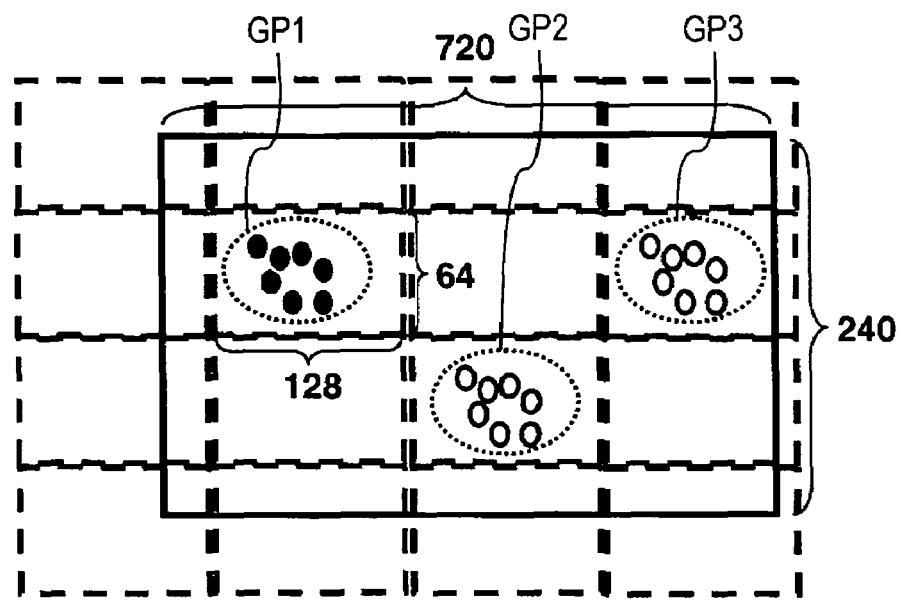
FIG. 12 is a schematic view showing a plurality of pieces of data that can be simultaneously read in the initial arrangement in which all the image data is stored in a memory in the specific example.

When all the image data is stored in the memory 50 in the manner described above, as shown in FIG. 12, a desired number of pieces of data GP1, GP2, and GP3 in the region of 128×64, which is divided in this manner, can be simultaneously read.

Next, when the data extends over the regions of 128×64, simultaneous reading of a desired number of pieces of data cannot be performed. Therefore, when each region of 128×64 is read in the initial arrangement shown in FIG. 13, some of the data is interchanged and overwritten.

Figure 14:
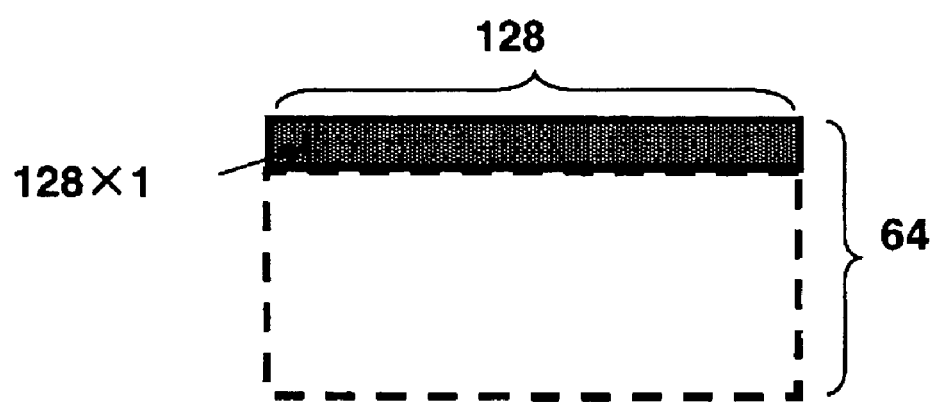
FIG. 14 is a schematic view showing an overwriting position in the specific example.

For example, as shown in FIG. 14, the data in the region of 128×1 within the region of 128×64 is read, and the data is overwritten at the position of 128×1 in the adjacent region of 128×64.

At that time, the first data in the region of 128×1 is saved to the unused portion of the memory 50 so that the data is not erased.

As a result of repeating this operation, the region of 128×64 is moved in sequence, and the data in the region of 128×64 can be simultaneously read. Therefore, by repeating this operation, a desired number of pieces of data of all the image data can be read.

Figure 13:
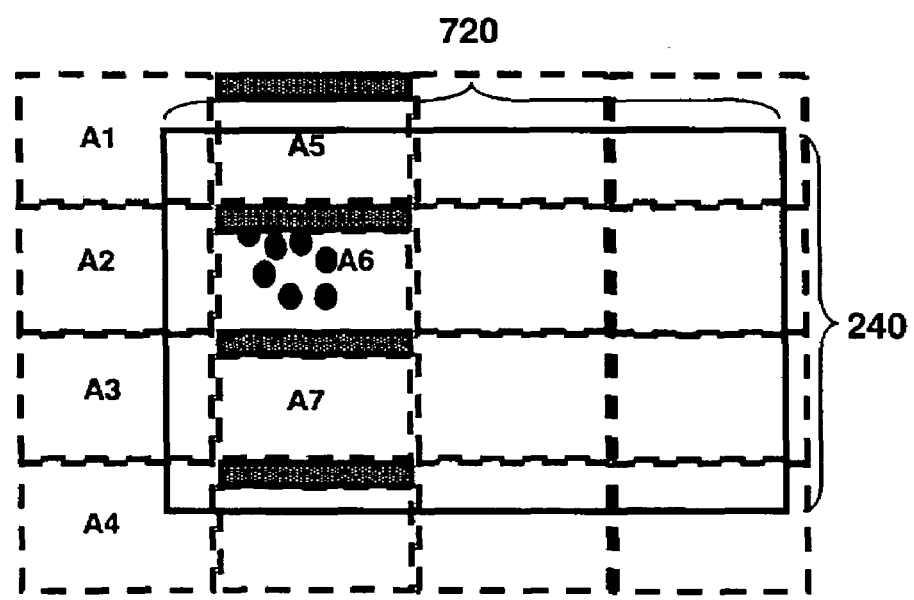
FIG. 13 is a schematic view illustrating interchanging and overwriting of data in the specific example.

Here, in the example shown in FIG. 13, after the shading portion of the region A6 is read, the data is overwritten in the shading portion of the region A5. Next, after the shading portion of the region A7 is read, the data is overwritten in the shading portion of the region A6. Hereafter, this operation is repeated.

Figure 15:
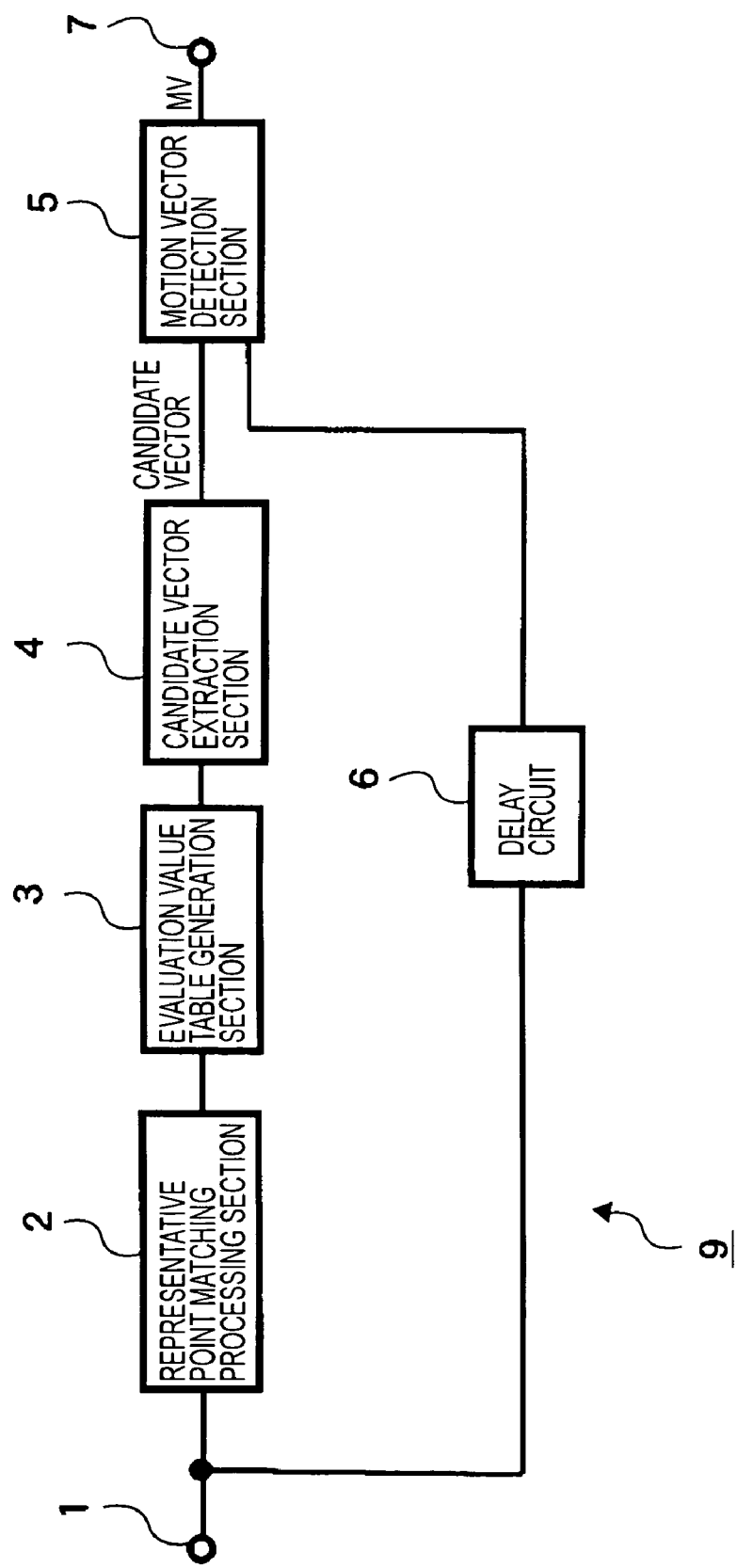
FIG. 15 is a block diagram showing the configuration of an image motion detection apparatus to which the present invention is applied.

The present invention is applied to, for example, an image motion detection apparatus 9 having a configuration shown in FIG. 15. Of course, the image motion detection apparatus 9 is only an application example, and the present invention can be applied to those other than this application example.

In the image motion detection apparatus 9, a digital video signal is supplied to an input terminal 1. The digital video signal is such that, for example, a luminance signal is sampled at a predetermined frequency and the samples (pixels) are each converted into 8 bits. The digital video signal is supplied to a representative point matching processing section 2.

Figure 16:
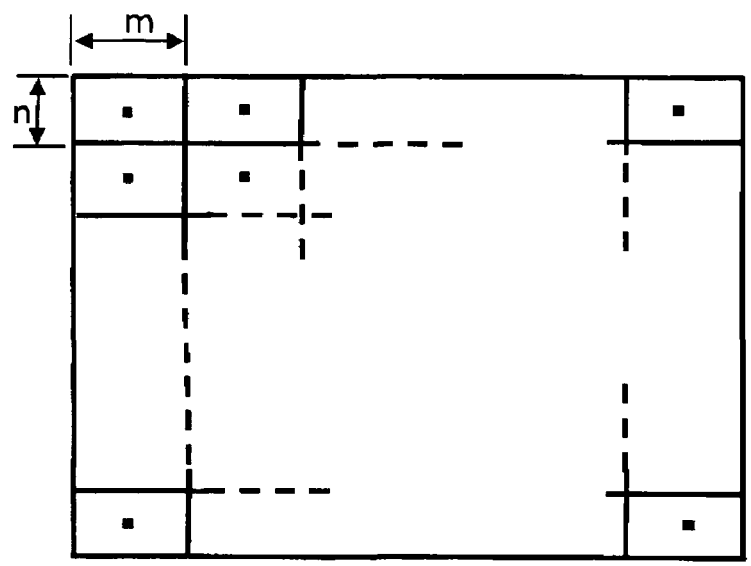
FIG. 16 is a schematic view illustrating representative point block matching in the image motion detection apparatus.

The representative point matching processing section 2 converts the image into an image composed of representative points by performing a thinning process on the image of the previous frame and performs a matching process between the image of the current frame and the image composed of the representative points of the previous frame in a manner similar to the block matching. The representative points, as shown in FIG. 16, are data representing each block when one screen, for example, an image of one frame, is divided into a plurality (m pixels×n lines) of blocks. As the representative point data, the value of the pixel at the center position of the block, the average value of the values of the pixels in the block, the intermediate values of the pixels in the block, etc., are used.

The representative point matching processing section 2 calculates an inter-frame difference between the reference frame image of the current frame and the candidate frame image of the previous frame composed of representative point data in the set search region. That is, the value of each of the m×n pixels of the block of the current frame is subtracted from the representative point data of a particular block of the previous frame. The m×n pixels of the block of the current frame are at the same position of the particular block of the previous frame. The absolute values of the subtraction outputs are integrated at one block, and the integration value of each block is integrated at one frame. This integration value is supplied to an evaluation value table generation section 3. In the evaluation value table generation section 3, the integration value determined at each position in the search region is stored in the memory, and an evaluation value table is generated in the memory.

By referring to the evaluation value table generated by the evaluation value table generation section 3, a candidate vector extraction section 4 extracts one or more candidate vectors. The extracted candidate vectors are supplied to a motion vector detection section 5. Input video data is supplied to the motion vector detection section 5 via a delay circuit 6. The delay circuit 6 delays the input video data by the amount of time required to delay the candidate vector. When the input video data is read from the memory, since the read video data needs only to be supplied to the motion vector detection section 5, it is not necessary to provide the delay circuit 6.

Figure 17:
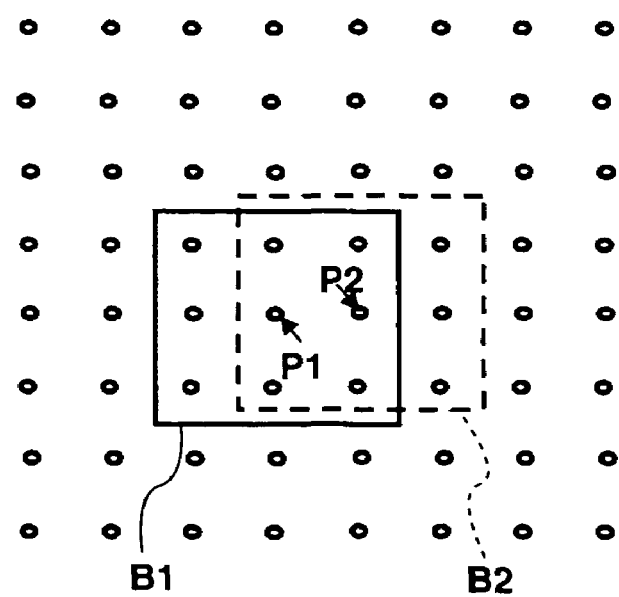
FIG. 17 is a schematic view illustrating a motion vector detection process in units of one pixel in the image motion detection apparatus.

The motion vector detection section 5 detects the motion vector in units of one pixel by a matching process using a candidate vector, and outputs the detected motion vector to an output terminal 7. Here, motion vector detection in units of one pixel is described. Also, in the motion vector detection in units of one pixel, blocking is performed to obtain an evaluation value. As shown in FIG. 17, for example, a 3×3 block B1 with the pixel P1 being the center is formed. The block B1 is, for example, the reference block of the current frame. The candidate block of the previous frame is also formed similarly. Then, the evaluation value table in the search region is generated by block matching. The motion vector is detected with regard to the pixel P1 in such a manner as to correspond to the minimum evaluation value in this evaluation value table. Next, a reference block is formed similarly with regard to the adjacent pixel P2. Then, an evaluation value table is generated similarly by block matching, and the motion vector with regard to the pixel P2 is detected on the basis of the evaluation value table. In this manner, the motion vector is detected for each pixel.

In general, in the process for detecting the motion vector for each pixel, the amount of calculations greatly increases when compared to the process for detecting the motion vector for each block, and the processing becomes complex. However, here, since the motion vector is detected by using only one or more candidate vectors extracted by the candidate vector extraction section 4, the amount of calculations can be prevented from being increased and the processing can be prevented from becoming complex.

Figure 18A:
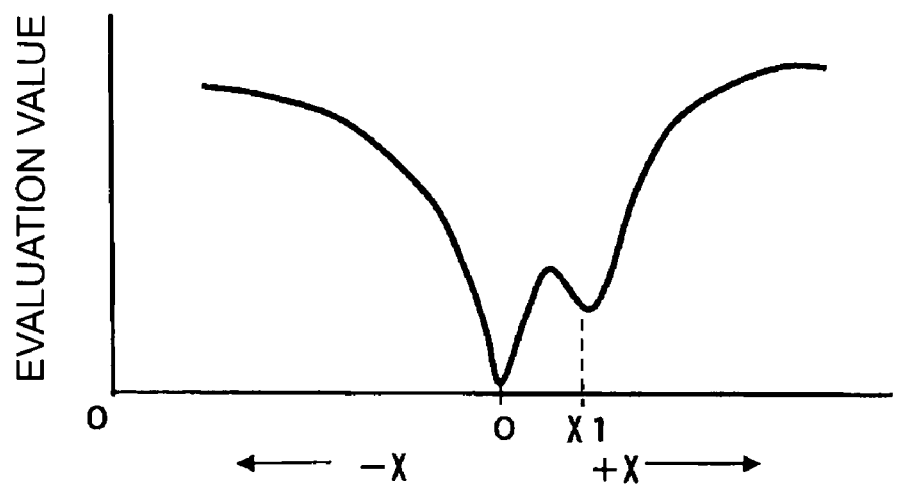
FIGS. 18A and 18B show an example of the distribution of evaluation values in the image motion detection apparatus.
Figure 18B:
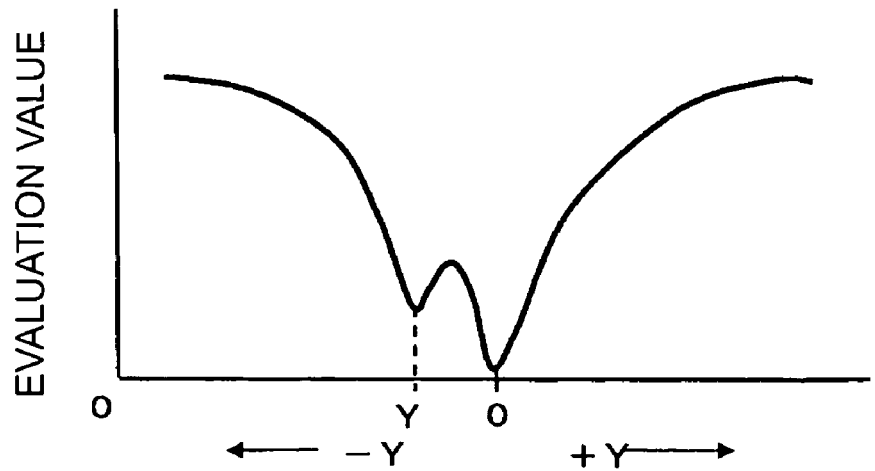

FIGS. 18A and 18B illustrate the processing of the candidate vector extraction section 4. In the evaluation value table generated by the evaluation value table generation section 3, the evaluation value exists as the z coordinate of the search region defined by the x and y coordinates. FIG. 18A is a conceptual view of an example of the distribution in the x direction of the evaluation value table, showing the distribution in the horizontal direction passing through, for example, y=y1. FIG. 18B is a conceptual view of an example of the distribution in the y direction of the evaluation value table, showing the distribution in the vertical direction passing through, for example, x=x1. It can be known from the evaluation value tables shown in FIGS. 18A and 18B that a relative minimum value exists in each of the origin in the coordinates and the point of (x=x1, y=y1). Such an evaluation value table is obtained in the case of an image in which an object that moves obliquely to the background (still image) exists.

The candidate vector extraction section 4 searches such an evaluation value table for a relative minimum value and extracts a candidate vector corresponding to the relative minimum value. In the examples of FIGS. 18A and 18B, the motion vector of (x=0, y=0) and the motion vector of (x=x1, y=y1) are extracted as candidate vectors. Here, for the sake of simplicity of description, an example of an evaluation value table in which two relative minimum values exist clearly is described. However, in practice, a larger number of relative minimum values exist, the magnitude of each relative minimum value differs, and the shape of the curve drawn by each relative minimum value and surrounding evaluation values differs. In such a case, the candidate vector extraction section 4 reduces the number of candidates so that an appropriate candidate vector is extracted. That is, the relative minimum value is compared with a threshold value, and the relative minimum value greater than the threshold value is not used for the candidate vector. Furthermore, the sharpness of the curve drawn by the relative minimum values and the surrounding evaluation values is detected, and by comparing the detected sharpness with the threshold value, the smaller sharpness is not used for the candidate vector.

Figure 19:
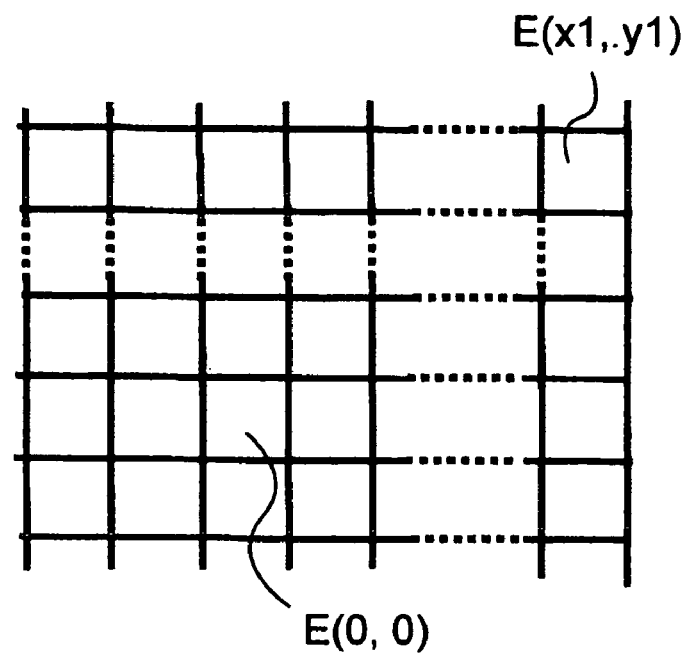
FIG. 19 shows an example of an evaluation value table in the image motion detection apparatus.
Figure 20:
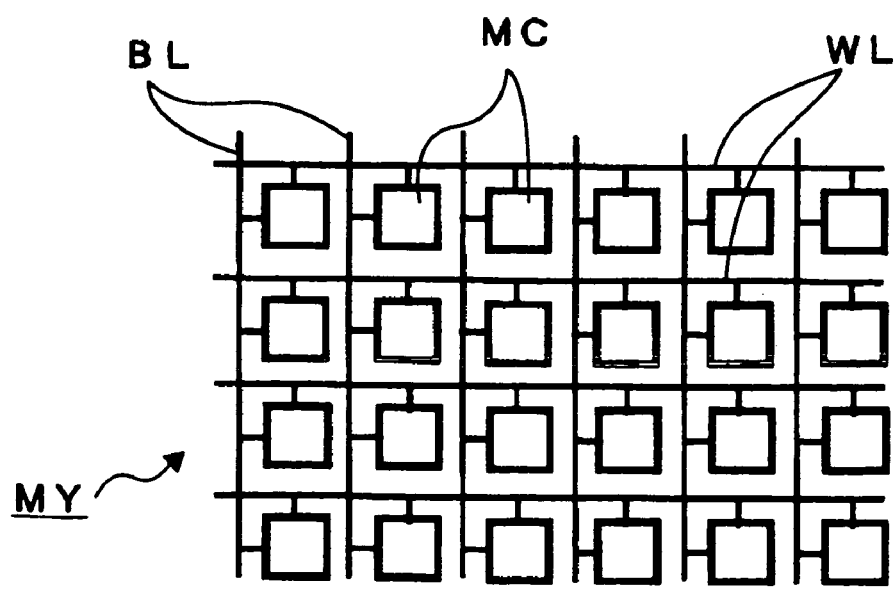
FIG. 20 is a schematic view showing the structure of a general semiconductor memory.
Figure 21:
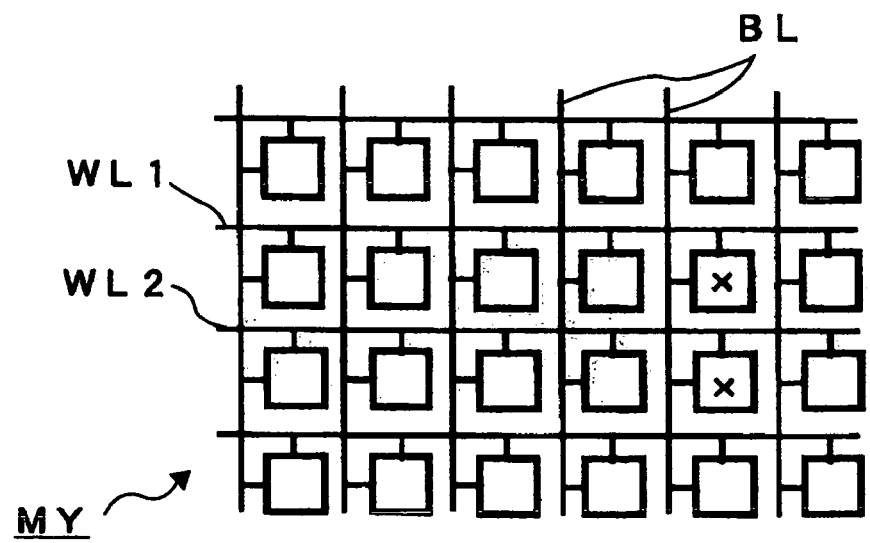
FIG. 21 is a schematic view showing a state in which simultaneous access cannot be made in the semiconductor memory.
Figure 22:
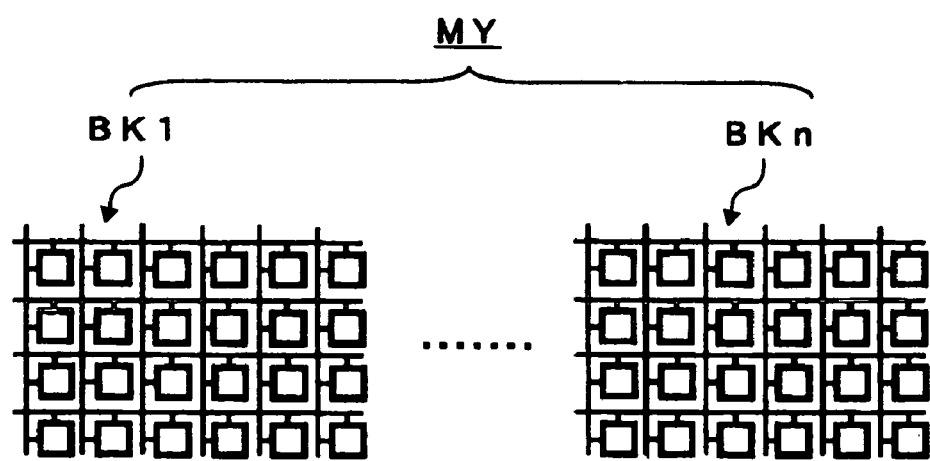
FIG. 22 shows the memory structure of a plurality of memory banks.

By using only the candidate vector that is extracted in this manner, the motion vector detection section 5 determines, for each pixel, the motion vector that is deemed to be best from among the candidate vectors. As in the above-described example, when two candidate vectors are given, two evaluation values are formed with regard to the pixel of interest by a matching process, as shown in FIG. 19. One evaluation value E(0, 0) corresponds to the motion vector of (x=0, y=0), and another evaluation value E(x1, y1) corresponds to the motion vector of (x=x1, y=y1).

An example of a method for determining the best motion vector on the basis of an evaluation value is described below. A minimum evaluation value from among the evaluation values determined in such a manner as to correspond to each of the candidate vectors is generated, and the evaluation value whose magnitude is sufficiently small is selected as the best motion vector. For example, when the evaluation value E(0, 0) is a minimum and the evaluation value E(0, 0) is a sufficiently small value, (x=0, y=0) is selected as a motion vector MV. On the other hand, when the evaluation value E(x1, y1) is a minimum and the evaluation value E(x1, y1) is a sufficiently small value, (x=x1, y=y1) is selected as a motion vector MV. Regarding a pixel in which these conditions are not satisfied, the motion vector is undefined. In addition to this method for determining the best motion vector from the candidate vectors, another method is possible.

In the image motion detection apparatus 9 having such a configuration, it is necessary to read a desired number of pieces of data in the representative point matching process of the representative point matching processing section 2 and in the candidate vector assignment process of the candidate vector extraction section 4. As a result of providing the data storage apparatus 100 having the configuration shown in FIG. 1 described above, a desired number of pieces of data are read from the data storage apparatus 100, and the representative point matching process in the representative point matching processing section 2 and the candidate vector assignment process in the candidate vector extraction section 4 are performed. Furthermore, after motion detection is performed by representative point matching using a two-step method, also, in the tap pull-up process for pulling up the surrounding pixels of the motion vector of each frame, a desired number of pieces of data can be read from the data storage apparatus 100.

The present application contains subject matter related to Japanese Patent Application No. JP 2004-000570 filed in the JPO on Jan. 5, 2004, the entire contents of which being incorporated hereby by reference.

What is claimed is:

1. A data storage apparatus comprising:
 a memory composed of a plurality of memory banks;
 data division determination means for determining the region in which a desired number of pieces of data to be read simultaneously exist as data division units on the basis of a detection pattern; and
 memory control means for controlling writing/reading of data to and from said memory,
 wherein said memory control means divides all data into a plurality of data regions on the basis of the division units from said data division determination means, allocates the data in each region among said plurality of memory banks, and stores the data in one word line in each of the memory banks, so that control is performed in such a way that a plurality of pieces of data to be simultaneously read in each of said regions is periodically read from all of said data arranged in said memory, some of the data in each of said regions is sequentially replaced with or rewritten with the data of the adjacent region, and a plurality of pieces of data to be read simultaneously next are read.

2. The data storage apparatus according to claim 1, wherein said memory control means performs simultaneous reading of a desired number of pieces of data with respect to all the data by repeating a periodic reading of a plurality of pieces of data to be read simultaneously in each region and writing at least some of said plurality of pieces of said read data after the data in a location where writing is performed is saved.

3. A data storage control apparatus comprising:
   data division determination means for determining the region in which a desired number of pieces of data to be read simultaneously exist as data division units on the basis of a detection pattern; and
   memory control means for controlling writing/reading of data to and from said memory composed of a plurality of memory banks,
   wherein said memory control means divides all data into a plurality of data regions on the basis of the division units from said data division determination means, allocates the data in each region among said plurality of memory banks, and stores the data in one word line in each of the memory banks, so that control is performed in such a way that a plurality of pieces of data to be simultaneously read in each of said regions is periodically read from all of said data arranged in said memory, some of the data in each of said regions is sequentially replaced with or rewritten with the data of the adjacent region, and a plurality of pieces of data to be read simultaneously next are read.

4. The data storage control apparatus according to claim 3, wherein said memory control means performs simultaneous reading of a desired number of pieces of data with respect to all the data by repeating a periodic reading of a plurality of pieces of data to be read simultaneously in each region and writing at least some of said plurality of pieces of said read data after the data in a location where writing is performed is saved.

5. A data storage control method comprising the steps of:
   dividing all data into a plurality of data regions by using the region in which a desired number of pieces of data to be read simultaneously exist as division units when all data is stored in a memory composed of a plurality of memory banks;
   allocating the data in each region among said plurality of memory banks;
   storing the data in one word line in each memory bank;
   periodically reading a plurality of pieces of data to be simultaneously read in each of said regions from all of said data arranged in said memory;
   sequentially replacing or rewriting some of the data in each of said regions with the data within the adjacent region; and
   reading a plurality of pieces of data to be simultaneously read next.

6. The data storage control method according to claim 5, wherein simultaneous reading of a desired number of pieces of data is performed with respect to all the data by repeating a periodic reading of a plurality of pieces of data to be read simultaneously in each region and writing at least some of said plurality of pieces of said read data after the data in a location where writing is performed is saved.

7. The data storage control method according to claim 5, wherein, in a process of performing image motion detection by representative point matching of a two-step method, a desired number of pixel data patterns in the image is simultaneously read.

8. A data storage control program for enabling a computer to perform data storage control for storing all data in a memory composed of a plurality of memory banks and for performing simultaneous reading of a desired number of pieces of data, said data storage control program comprising:
   dividing all the data into a plurality of data regions by using the region in which a desired number of pieces of data to be simultaneously read exist as division units when all the data is stored in the memory composed of a plurality of memory banks;
   allocating the data in each region among said plurality of memory banks;
   storing the data in one word line in each memory bank;
   periodically reading a plurality of pieces of data to be simultaneously read in each of said regions from all of said data arranged in said memory;
   sequentially replacing or rewriting some of the data in each of said regions with the data within the adjacent region; and
   reading a plurality of pieces of data to be simultaneously read next.

9. The data storage control program according to claim 8, wherein simultaneous reading of a desired number of pieces of data is performed with respect to all the data by repeating a periodic reading of a plurality of pieces of data to be read simultaneously in each region and writing at least some of said plurality of pieces of said read data after the data in a location where writing is performed is saved.

10. The data storage control program according to claim 8, wherein, in a process of performing image motion detection by representative point matching of a two-step method, a desired number of pixel data patterns in the image is simultaneously read.

* * * * *